(12) United States Patent
Babcock et al.

(10) Patent No.: US 6,770,952 B2
(45) Date of Patent: Aug. 3, 2004

(54) INTEGRATED PROCESS FOR HIGH VOLTAGE AND HIGH PERFORMANCE SILICON-ON-INSULATOR BIPOLAR DEVICES

(75) Inventors: Jeffrey A. Babcock, Neufahrn (DE); Gregory E Howard, Dallas, TX (US); Angelo Pinto, Munich (DE); Phillipp Steinmann, Munich (DE); Scott G. Balster, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/132,817

(22) Filed: Apr. 25, 2002

(65) Prior Publication Data

US 2002/0160562 A1 Oct. 31, 2002

Related U.S. Application Data

(60) Provisional application No. 60/287,462, filed on Apr. 30, 2001.

(51) Int. Cl.[7] ............................................. H01L 27/082
(52) U.S. Cl. ........................ 257/565; 257/517; 257/526; 257/500
(58) Field of Search ................................ 257/500, 517, 257/525, 526, 565, 499

(56) References Cited

U.S. PATENT DOCUMENTS

| 5,583,059 A | | 12/1996 | Burghartz |
| 5,994,740 A | * | 11/1999 | Nakagawa et al. ......... 257/350 |
| 6,404,038 B1 | * | 6/2002 | Cartagena ................... 257/586 |

OTHER PUBLICATIONS

Nil et al., "A Novel Lateral Bipolar Transistor with 67 GHz fmax on Thin–Film SOI for RF Analog Applications," *IEEE Transactions on Electron Devices*, vol. 47, No. 7, Jul. 2000, pp. 1536–1541.

G. G. Shahidi et al., "A Novel High–Performance Lateral Bipolar on SOI," *IEDM 91–665*, pp. 26.1.1–26.1.4.

R. Dekker et al., "An Ultra Low–Power RF Bipolar Technology on Glass," *IEDM 97–921*, pp. 3.6.1–3.6.3.

R. Dekker et al., "An Ultra Low Power Lateral Bipolar Polysilicon Emitter Technology on SOL," *IEDM 93–75*, pp. 4.4.1–4.4.4.

Wen–Ling M. Huang et al., "TFSOI Complementary BiCMOS Technology for Low Power Applications," *IEEE Transactions on Electron Devices*, vol. 42, No. 3, Mar. 1995, pp. 506–512.

A. Q. Huang et al., "Novel High Voltage SOI Structures," *IEEE BCTM 5.3*, pp. 84–88.

* cited by examiner

Primary Examiner—Tuan H. Nguyen
(74) Attorney, Agent, or Firm—Yingsheng Tung; Wade James Brady, III; Frederick J. Telecky, Jr.

(57) ABSTRACT

High-voltage bipolar transistors (30, 60) in silicon-on-insulator (SOI) integrated circuits are disclosed. In one disclosed embodiment, an collector region (28) is formed in epitaxial silicon (24, 25) disposed over a buried insulator layer (22). A base region (32) and emitter (36) are disposed over the collector region (28). Buried collector region (31) are disposed in the epitaxial silicon (24) away from the base region (32). The transistor may be arranged in a rectangular fashion, as conventional, or alternatively by forming an annular buried collector region (31). According to another disclosed embodiment, a high voltage transistor (60) includes a central isolation structure (62), so that the base region (65) and emitter region (66) are ring-shaped to provide improved performance. A process for fabricating the high voltage transistor (30, 60) simultaneously with a high performance transistor (40) is also disclosed.

8 Claims, 8 Drawing Sheets

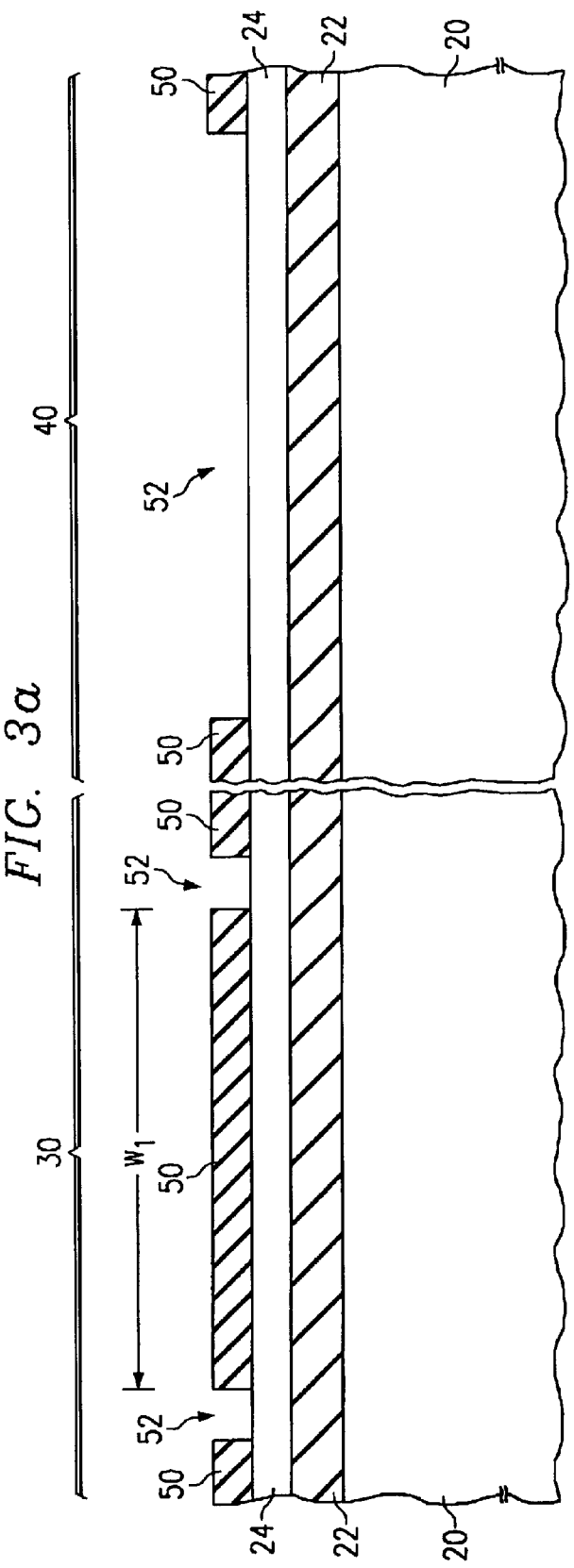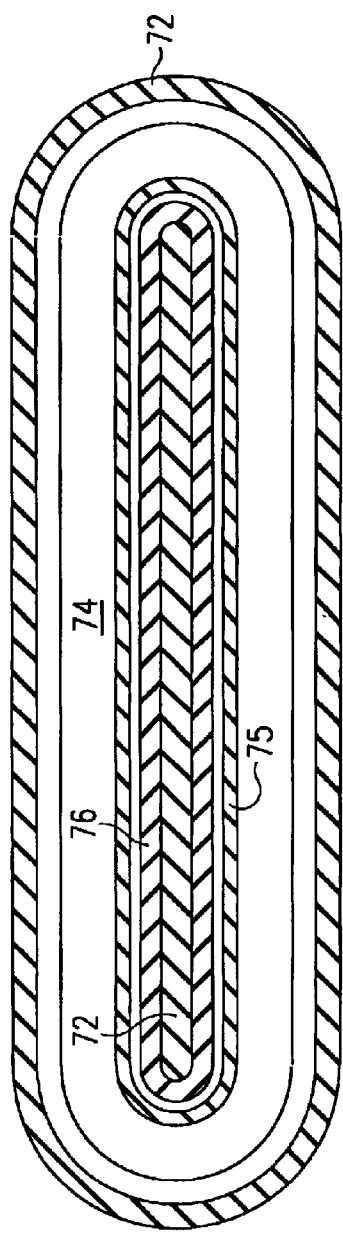

INTEGRATED PROCESS FOR HIGH VOLTAGE AND HIGH PERFORMANCE SILICON-ON-INSULATOR BIPOLAR DEVICES

CROSS-REFERENCE TO RELATED APPLICATIONS

This application claims priority under 35 USC §119(e)(1) of provisional application Nos. 60/287,462 filed Apr. 30, 2001.

STATEMENT REGARDING FEDERALLY SPONSORED RESEARCH OR DEVELOPMENT

Not applicable

BACKGROUND OF THE INVENTION

This invention is in the field of bipolar transistor fabrication, and is more specifically directed to the fabrication of transistors having varying characteristics on a common substrate according to silicon-on-insulator (SOI) technology.

Integrated circuits have utilized bipolar junction transistors for many years, taking advantage of their high gain characteristics to satisfy high performance and high current drive needs. In particular, as is well known in the art, bipolar transistors are especially well-suited for high frequency applications, such as now used in wireless communications.

Silicon-on-insulator (SOI) technology is also well-known in the art as providing important advantages in high-frequency electronic devices. As is fundamental in SOI technology, active devices such as transistors are formed in single-crystal silicon layers formed over an insulator layer, such as a layer of silicon dioxide commonly referred to as buried oxide. The buried oxide layer isolates the active devices from the underlying substrate, effectively eliminating parasitic nonlinear junction capacitances to the substrate and reducing collector-to-substrate capacitances. To the extent that high frequency performance of bulk transistors was limited by substrate capacitance, SOI technology provides significant improvement.

In addition, SOI devices are robust in high voltage applications. The buried oxide layer effectively eliminates any reasonable possibility of junction breakdown to the substrate.

However, it has been observed that those transistor features that facilitate high frequency performance tend to weaken the device from a high bias voltage standpoint, and vice versa. This tradeoff has typically been addressed by separately manufacturing high voltage integrated circuits and high performance integrated circuits, with each integrated circuit having transistors optimized for their particular implementation. This is because the process complexity resulting from integrating both high voltage and high performance devices in the same SOI integrated circuit adds significant cost and exerts manufacturing yield pressure.

This tradeoff will be further described relative to FIG. 1, which illustrates a conventional high-performance p-n-p bipolar transistor 2 formed in an SOI device. An n-p-n device would be formed substantially identically as shown in FIG. 1, but with opposite doping conductivity types. Indeed, in many applications, complementary bipolar circuits are formed in the same SOI integrated circuit, having both n-p-n and p-n-p devices formed in this manner.

In this example, substrate 4 effectively serves as a support, or handle wafer for the structure. Buried oxide layer 6 and overlying epitaxial layer 8 are formed at a surface of substrate 4 by the conventional techniques of oxygen implantation, wafer bonding, or smart cut techniques. Epitaxial layer 8 is relatively heavily doped p-type in this example, and serves as a buried collector region. In this example, deep trench isolation structure 7 separates individual structures in epitaxial layer 8, thus isolating buried collectors from one another in the integrated circuit. Another epitaxial layer, including portions 10, 12 in this example, is then disposed above and in contact with buried layer 8 in selected locations, separated by shallow trench isolation structures 9. As shown in FIG. 1, shallow trench isolation structures 9 are contiguous with deep trench isolation structures 7 in certain locations to isolate individual devices from one another.

Epitaxial layer 10 is doped in various locations in the definition of transistor 2. In this example, one epitaxial layer portion is heavily doped n-type to serve as collector sinker contact 12; a still heavier doped region 13 is provided at the surface of sinker 12, to further improve the ohmic contact to the collector of transistor 2. Another portion of epitaxial layer is more lightly-doped, either in-situ with its epitaxial formation or by subsequent ion implantation, to form collector region 10.

Overlying collector region 10 is intrinsic base region 14. In this example, intrinsic base region 14 may be an n-type doped silicon layer, or an n-type silicon-germanium layer, epitaxially deposited or otherwise formed at the surface of collector region 10. As known in the art, the use of a silicon-germanium base provides a high performance heterojunction device, while a silicon base provides a lower performance device at lower manufacturing cost. Extrinsic base structures 15 are disposed adjacent intrinsic base region 14, to provide a location at which electrical contact to the base may be made. Transistor 2 is completed by the formation of extrinsic emitter 16, which may be a heavily doped p-type element formed of polysilicon, and from which emitter region 17 diffuses. As a result of this construction, in the operation of transistor 2, collector-emitter current is conducted substantially by region 11 within collector region 10.

Each of collector contact 13, extrinsic base region 15, and emitter electrode 16, in transistor 2 according to this embodiment of the invention are made further conductive by the formation of self-aligned silicide layers 18c, 18b, 18e, respectively.

By way of further background, the conventional construction of a bipolar junction transistor is also described in the prior art. U.S. Pat. No. 5,583,059 is an example of such conventional construction.

Referring back to FIG. 1, conventional SOI bipolar transistor 2 is contemplated to be a high performance device. The high performance aspect of transistor 2 is evident by the provision of the heterojunction intrinsic base region 14, as well as by the provision of a heavily-doped buried collector 8 underlying collector region 10, to provide a low collector resistance in transistor 2.

However, high performance transistor 2 is somewhat limited by its construction, from a standpoint of both breakdown voltage and performance. As is fundamental in the art and as applied to the example of FIG. 1, this collector-emitter breakdown voltage (BVCEO) depends upon the thickness of collector region 10 and upon the doping concentration of region 11; lighter doping of region 11, and a thicker collector region 10, would increase this breakdown voltage. On the other hand, particularly if intrinsic base region 14 is a heterojunction film, the transistor performance is dominated by collector transit time, which undesirably increases with more lightly doped and thicker collector regions. The optimization of bipolar transistor 2 relative to these two countervailing effects necessarily results in a tradeoff of breakdown voltage versus gain. Therefore, as noted above, it is typical for an integrated circuit to include specific transistors that are optimized for high voltage operation, and also specific transistors that are optimized for performance, rather than attempting to arrive at a single device structure that is optimized for both. However, this implementation of both classes of transistor results in an extremely complex process, doubly so in complementary bipolar processes.

BRIEF SUMMARY OF THE INVENTION

It is therefore an object of the present invention to provide a single manufacturing process suitable for producing both high voltage and high performance bipolar transistors in a silicon-on-insulator (SOI) device.

It is a further object of the present invention to provide a high-voltage bipolar transistor structure that is suitable for implementation in such a process.

It is a further object of the present invention to provide such a structure and process in which the definition of the high voltage transistor is tolerant of alignment and other process parameters.

It is a further object of the present invention to provide such a structure and process that does not involve additional processing steps.

It is a further object of the present invention to reduce the number of SOI integrated circuits required to implement both high performance and high voltage devices in an electronic system.

Other objects and advantages of the present invention will be apparent to those of ordinary skill in the art having reference to the following specification together with its drawings.

The present invention may be implemented in a bipolar manufacturing process and resulting structure in a silicon-on-insulator (SOI) technology. According to the present invention, high performance transistors are defined by relatively heavily doping the epitaxial layer underlying the location at which the eventual emitter will be placed. In the high-voltage devices, the epitaxial layer is heavily doped at the collector contacts but not underlying the emitter location. The locations of these various heavily doped regions in the epitaxial layer are defined by photolithographic masking of the epitaxial layer. The base and emitter regions are then formed over the doped epitaxial layer, resulting in both high voltage and high performance transistors in the same integrated circuit.

BRIEF DESCRIPTION OF THE SEVERAL VIEWS OF THE DRAWING

FIGS. 3a through 3d are cross-sectional views illustrating the construction of the high-voltage bipolar transistor of FIG. 2a, in combination with a corresponding high-performance bipolar transistor, according to the preferred embodiment of the invention.

FIG. 5 is a plan view of a high-voltage, high-power, bipolar transistor according to a third preferred embodiment of the invention.

DETAILED DESCRIPTION OF THE INVENTION

The present invention will now be described in connection with its preferred embodiments. These exemplary embodiments are directed to the fabrication of bipolar junction transistors in a silicon-on-insulator (SOI) structure. It will be appreciated by those skilled in the art having reference to this specification that the present invention may be used to form either p-n-p or n-p-n transistors, used in a complementary bipolar or BiCMOS technology, as well as used in other alternative structures and methods of fabricating such structures. Furthermore, while these embodiments are silicon or SiGe NPN and PNP bipolar transistors, it is contemplated that the present invention will be equally applicable to emerging bipolar technologies such as SiGeC (silicon-germanium-carbon) and SiC bipolar technologies It is therefore to be understood that these and other alternatives to the embodiments described below are contemplated to be within the scope of the invention as claimed.

Figure 2A:
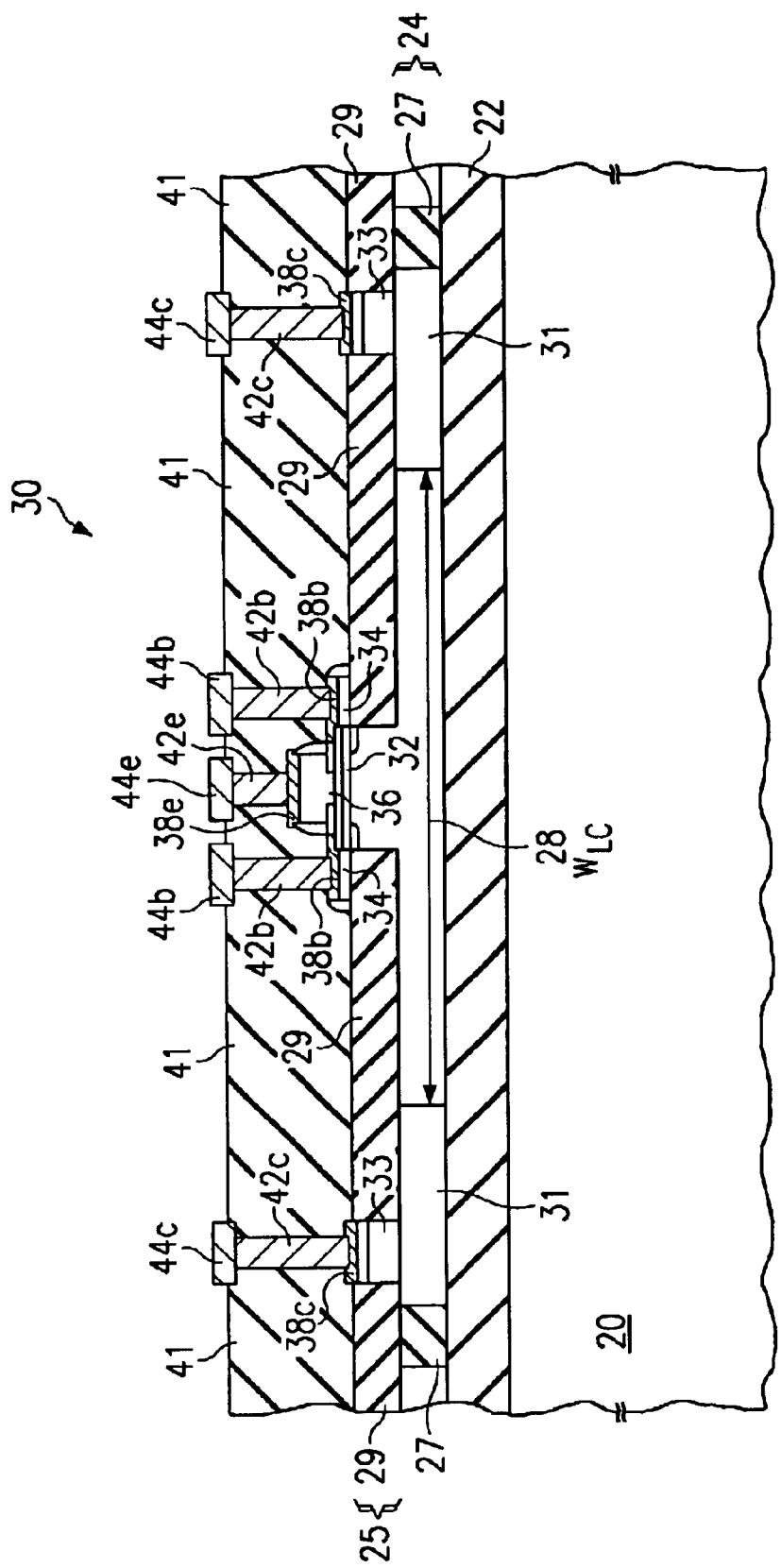
FIG. 2a is a cross-sectional view of a high voltage bipolar transistor according to a first preferred embodiment of the invention.

Referring first to FIG. 2a, the construction of p-n-p high-voltage transistor 30 according to the preferred embodiment of the invention will now be described in detail. The cross-section of transistor 30 in FIG. 2a illustrates buried insulator layer 22 in place over substrate, or handle wafer, 20 in the typical manner for silicon-on-insulator (SOI) structures. Buried insulator layer 22 is typically silicon dioxide, and as such is generally referred to as buried oxide. Transistor 30 is formed in and above buried oxide 22, with its collector disposed within epitaxial silicon layer 24.

Epitaxial layer 24 is a layer of single-crystal silicon. Transistor 30 is isolated from neighboring devices by way of deep trench isolation structures 27, formed of deposited silicon dioxide. According to this embodiment of the invention, the portion of epitaxial layer 24 associated with transistor 30 includes collector region 28 and buried collector portions 31. Collector region 28 in this embodiment of the invention is a relatively lightly doped p-type region, for example having a doping concentration of on the order of $1.0 \times 10^{16}$ $cm^{-3}$. Buried collector portions 31, on the other hand, are relatively heavily doped, with a p-type doping concentration of on the order of $1.0 \times 10^{19}$ $cm^{-3}$ for example. The function of buried collector portions 31 is to provide a highly conductive collector connection from collector terminals 44c to collector region 28. Collector region 28, on the other hand, serves as part of the active collector of transistor 30.

Shallow trench isolation structures 29, for example formed of deposited silicon dioxide, are disposed within selected portions of a second epitaxial layer 25 above the depth of buried collector portions 31. Shallow trench isolation structures 29 overlie deep trench isolation structures 27, to complete the electrical isolation of transistor 30 from neighboring devices. In addition, shallow trench isolation structures 29 are arranged to define the locations of collector contact sinker structure 33, as well as a portion of collector region 28 that extends to the base and emitter of transistor 30, as described below. Collector sinker structures 33 are heavily doped p-type silicon regions of epitaxial layer 25, and may have a p+ doped region at its surface to further improve ohmic contact. Silicide-clad collector contacts 38c are disposed at the surface of sinker structures 33 in this embodiment of the invention, further improving conductivity.

In the active region of transistor 30, intrinsic base region 32 is an n-type doped silicon or n-type silicon-germanium epitaxial layer disposed at the surface of collector region 10. Extrinsic base structures 34 are heavily doped n-type silicon regions surrounding intrinsic base region 32, and have silicide-clad ohmic base contacts 38b at portions of their surface. Extrinsic emitter 36 is disposed at the surface of intrinsic base region 32 between extrinsic base structures 34. Extrinsic emitter 36 is a heavily doped p-type polysilicon structure, which serves as a source of p-type dopant that diffuses into intrinsic base region 32 to form the emitter of the device. The surface of extrinsic emitter 36 has a silicide-clad emitter contact 38e.

Transistor 30 in this embodiment of the invention provides external collector, base, and emitter connections by way of contact plugs 42c, 42b, 42e, respectively, each of which extend through overlying insulator layer 41 to corresponding metal conductors 44c, 44b, 44e, respectively. Conductors 44c, 44b, 44e route connections to the collector, base, and emitter, respectively, to and from other devices in the same integrated circuit as transistor 30.

According to the preferred embodiment of the invention, transistor 30 is particularly well-suited for high voltage operation, especially relative to the collector-emitter breakdown voltage BVCEO. In this regard, this voltage is effectively defined by the collector path length from intrinsic base 32 to heavily-doped buried collector layers 31. The distance between opposing buried collector layers 31 is illustrated in FIG. 2a as distance $W_{LC}$; accordingly, the collector path length from intrinsic base 32 to buried collector layers 31 corresponds to distance $W_{LC}/2$.

From a plan view (top-down), transistor 30 is fabricated in a conventional rectangular, or linear, bipolar transistor arrangement. As is well known in the art, in this arrangement, the emitter and base structures will have a rectangular shape, with collector contacts and rectangular buried collector layers being placed on one or more sides of the emitter and base, in the usual manner. Of course, other plan arrangements may be used.

Figure 2B:
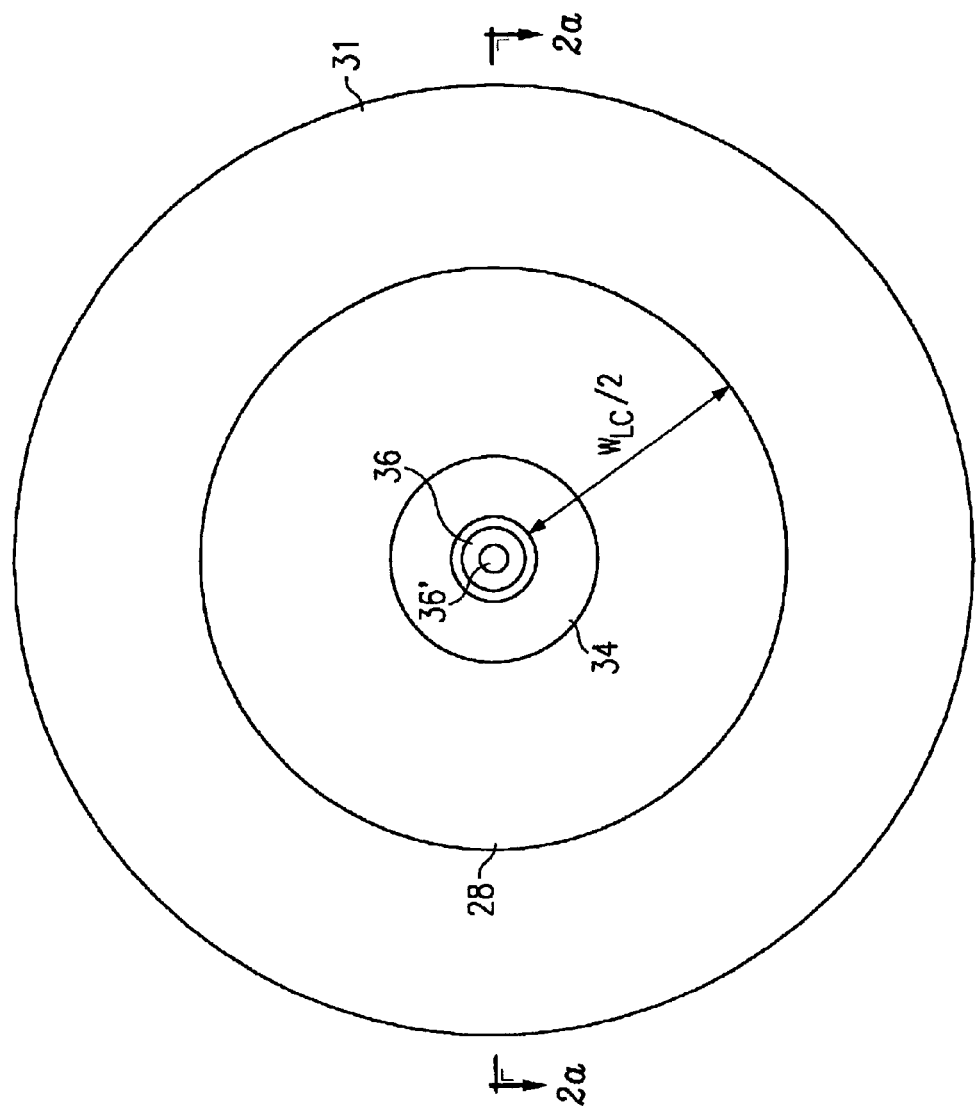
FIG. 2b is a plan view of one alternative implementation of the transistor of FIG. 2a according to the first preferred embodiment of the invention.

According to an alternative implementation, transistor 30 may be realized to have a plan view arrangement as shown in FIG. 2b, excluding contact plugs 42 and metal conductors 44. According to this implementation of the invention, transistor 30 has a circular shape, in which buried collector layer 31 is a contiguous annular doped region surrounding collector region 28. Each of extrinsic base 34, extrinsic emitter 36, and emitter region 36' (corresponding to the portion of extrinsic emitter 36 that is in physical contact with intrinsic base 32 in FIG. 2a), are annular or circular, as the case may be. As shown in FIG. 2b, this arrangement provides a uniform distance $W_{LC}/2$ for all possible conduction paths from the inner edge of extrinsic base regions 34, and thus from the outer edge of intrinsic base 32, to buried collector layer 31. In effect, therefore, the width of the conduction path through ollector region 28 is maximized, corresponding to the circumference of the inner edge of extrinsic base region 34.

According to this embodiment of the invention, the distance $W_{LC}/2$ may be defined simply by a photolithography operation, by way of which buried collector layer 31 is defined. As will be described below, this photolithography pattern can be easily placed, as the dimensions and alignment of this patterning need not be carried out at the highest available precision. In addition, as will become apparent from the following description of the method of fabricating transistor 30, this construction permits the simultaneous formation of high voltage transistor 30 with high-performance transistors, as will now be described relative to FIGS. 3a through 3d.

FIG. 3a illustrates an early stage in the fabrication of high voltage transistor 30 described above, in combination with high performance bipolar transistor 40. In this example, each of transistors 30, 40 are p-n-p devices; it is to be understood that n-p-n transistors may be similarly formed by selecting the dopant species accordingly. At this stage of the process, substrate 20 is provided as support for the eventual structure, serving as a handle wafer. Typically, silicon substrate 20 has a relatively high resistance, considering that its primary function is structural rather than electrical. Buried oxide layer 22 and overlying epitaxial layer 24 are then formed, for example by the conventional techniques of SIMOX or wafer bonding. In this preferred embodiment of the present invention in which transistors 30, 40 are p-n-p devices, epitaxial layer 24 is a lightly doped p-type layer, formed to an initial thickness of on the order of 1.25 μm.

Following the formation of epitaxial layer 24, oxide mask layer 50 is formed by thermal oxidation of epitaxial layer 24 to a thickness sufficient to block ion implantation. In this example, oxide mask layer 50 is formed of thermal silicon dioxide to a thickness of on the order of 1.0 μm. This thermal oxidation consumes epitaxial layer 24 accordingly, for example down to a thickness of approximately 0.8 μm. Of course, oxide mask layer 50 may alternatively be deposited, if desired.

According to the preferred embodiment of the invention, the locations of buried doped layers are defined by patterning and removing selected locations 52 of oxide mask layer 50. This patterning is preferably performed by way of conventional photolithography and etching, in which photoresist is dispensed, exposed through a photomask, and removed to expose selected locations of oxide mask layer 50; a conventional plasma or wet etch is then performed to remove the exposed locations of oxide mask layer 50. Following the removal of the remaining photoresist, the resulting structure appears in the form illustrated in FIG. 3a.

As shown in FIG. 3a, opening locations 52 correspond to the eventual location of relatively heavily-doped collector regions. The difference in construction between high voltage transistor 30 and high performance transistor 40 is substantially defined by the width and location of these opening locations 52. In the region where high voltage transistor 30 is to be formed, opening locations 52 are relatively small, and are separated from the center of the transistor region. As shown in FIG. 2b, opening locations 52 in transistor 30 preferably correspond to diametrically separated locations of a contiguous annular collector contact. In any case, oxide mask layer 50 includes a portion having a layout width $W_1$; as will be described below, the base and emitter of transistor 30 will be formed over the portion of epitaxial layer 24 underlying the portion of oxide mask layer 50 of width $W_1$.

In contrast, opening location 52 for high performance transistor 40 is a relatively large region, including most of the area of transistor 40. As described above relative to FIG. 1, and as will become apparent from the following description, the collector region underlying the eventual emitter of transistor 40 is heavily doped to minimize the collector resistance of the device. Of course, because this improved collector conductivity is achieved at a cost of reduced breakdown voltage, circuit applications typically limit the bias voltages of transistor 40.

Figure 3B:
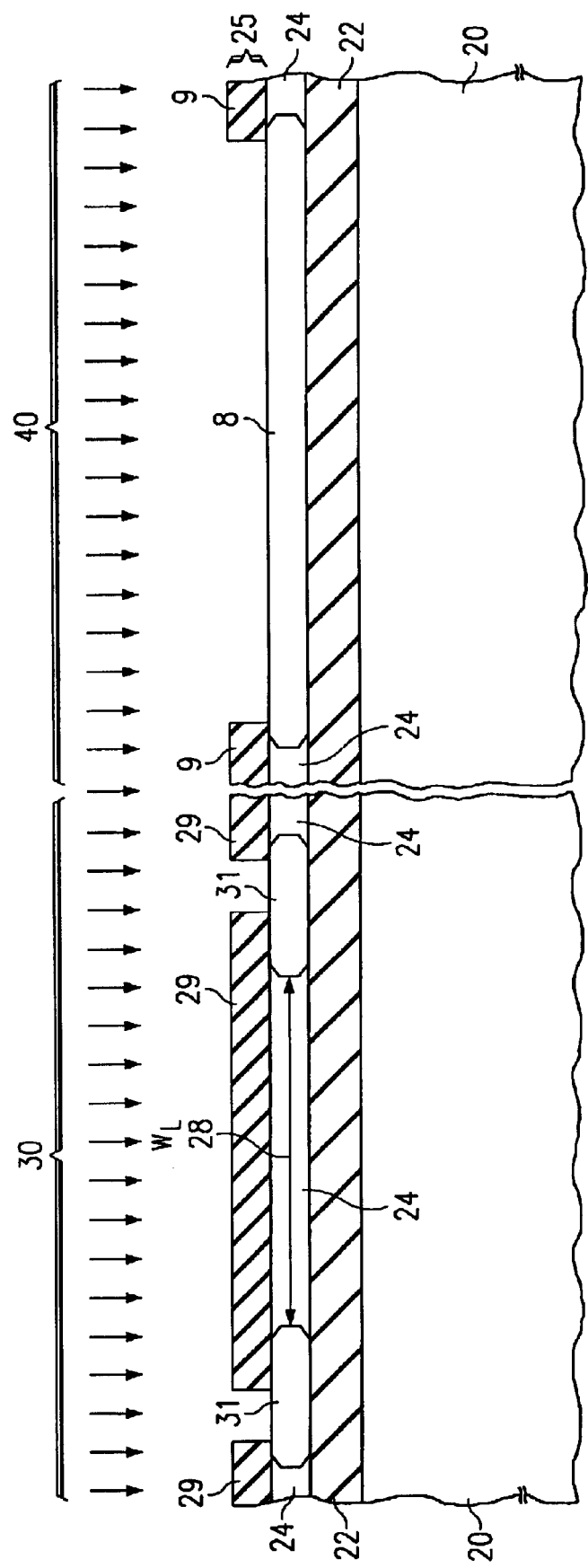

Following the definition of oxide mask layer 50 and its openings at opening locations 52, the structure is subjected to ion implantation to dope the portions of epitaxial layer 24 at the locations exposed by opening locations 52, as shown in FIG. 3b In this example, where transistors 30, 40 are p-n-p devices, this implantation operation implants p-type dopant at these locations, at a relatively heavy dose such as $1.0 \times 10^{16}$ cm$^{-2}$ at 30 keV. Following a corresponding anneal, buried p+ collector regions 31, 8 are formed in epitaxial layer 24 at the locations of transistors 30, 40, respectively. In the area of transistor 30, collector region 28 is masked from this implantation by oxide mask layer 50. The width of collector region 28 is shown as distance $W_L$ as shown in FIG. 3b (and in FIG. 2a discussed above). Distance $W_L$ is somewhat reduced from layout width $W_1$ of oxide mask layer 50, due to lateral diffusion of the implanted dopant in the subsequent anneal.

Figure 1:
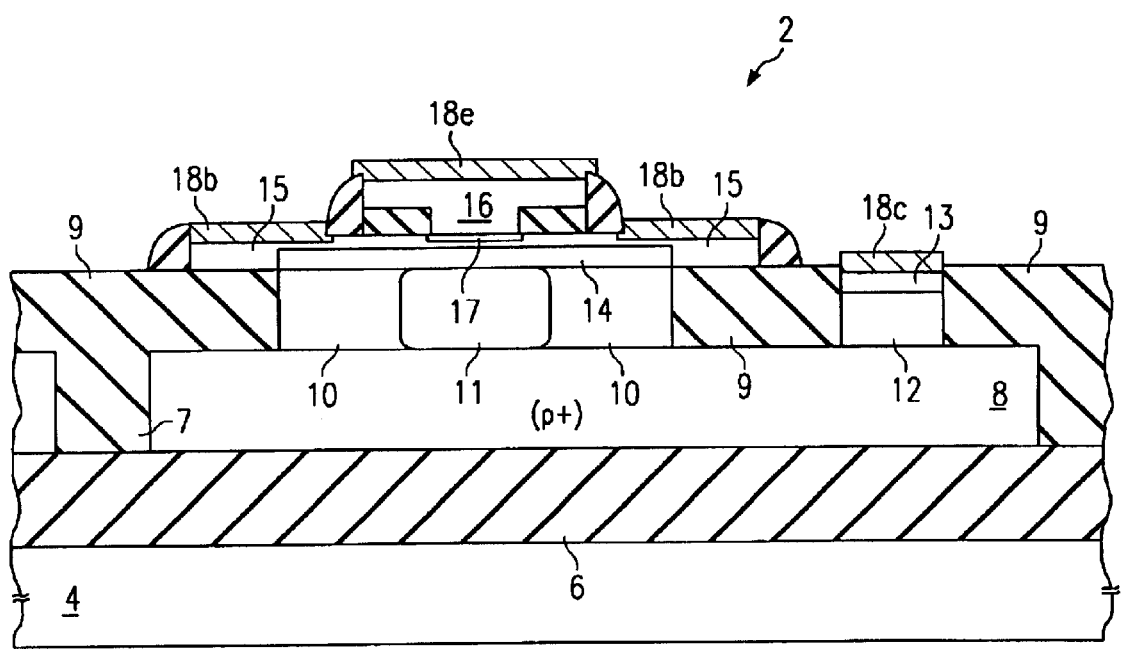
FIG. 1 is a cross-sectional diagram of a conventional high-performance bipolar transistor.
Figure 3C:
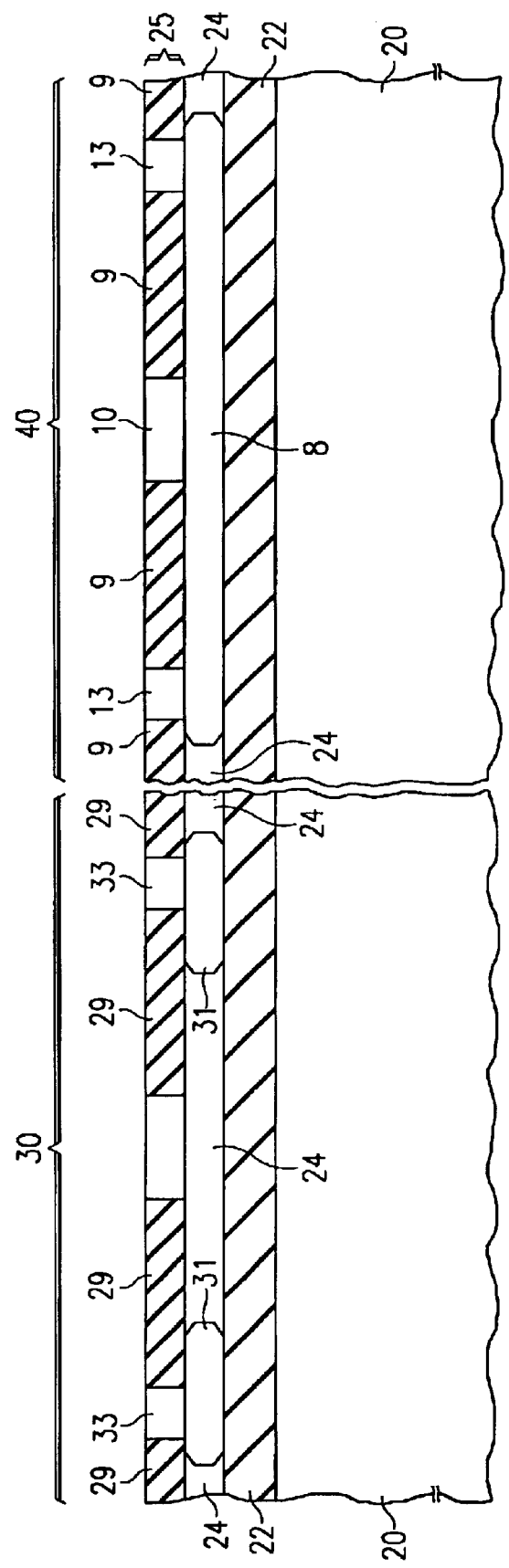

Referring now to FIG. 3c, the construction of transistors 30, 40 continues with the removal of oxide mask layer 50 overall, followed by epitaxial growth of silicon, from the surface of epitaxial layer 24L, to form second epitaxial layer 25. Selected portions of this epitaxial layer 25 are then removed, by photolithographically patterning a mask layer and then performing a wet or plasma silicon etch to the desired depth, to define the locations of shallow trench isolation structures 9, 29. A second patterning and etch step into epitaxial layer 24 may also be performed at this time to form the locations deep trench isolation structures 7, 27 as shown in FIGS. 1 and 2a respectively. Both the deep and shallow isolation structures are preferably formed by depositing silicon oxide into the openings, and then planarizing the structure, producing shallow trench isolation structures 9, 29 as shown in FIG. 3c. Deep trench isolation structures 7, 27 are not shown in FIG. 3c for the sake of clarity.

In the region of transistor 30, the remaining vertical portion of epitaxial layer 25 effectively merges into collector region 28; in the region of transistor 40, this remaining vertical portion of epitaxial layer 25 becomes collector region 10. If desired, adjustment of the collector characteristics in either or both of transistors 30, 40 may be made by way of in-situ doping during epitaxy in the formation of epitaxial layer 25, or alternatively by way of ion implantation of epitaxial layer 25 after its formation. If transistors 30, 40 are being formed in combination with MOS transistors, for example in a BiCMOS process, this additional implant may correspond to a well implant for the corresponding MOS devices, and thus coming at no additional cost.

In addition, other portions of epitaxial layer 25 also remain as a result of the patterning and silicon etch, to form collector sinker structures 13, 33 in transistors 30, 40, as discussed above. These sinker structures are preferably implanted with a masked p-type dopant, to increase the conductivity of these sinker structures. The resulting structure is illustrated in FIG. 3c.

Figure 3D:
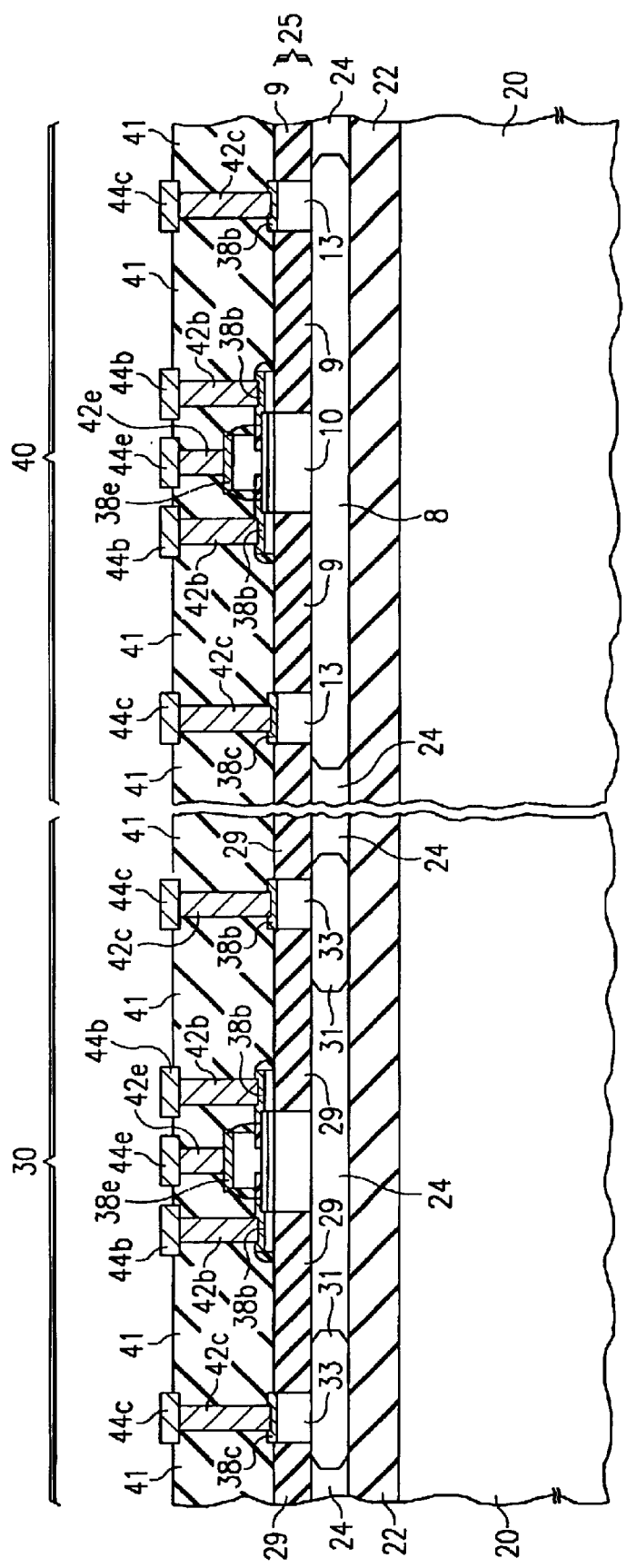

Each of transistors 30, 40 may now be completed in the conventional manner, resulting in the structures shown in FIG. 3d. According to this embodiment of the invention, these remaining steps may be performed simultaneously for transistors 30, 40. In summary, intrinsic and extrinsic base regions (either silicon, or silicon-germanium) are formed by epitaxial deposition, its implantation as necessary, and photolithographic patterning and etching. The extrinsic emitter regions are then deposited and doped as appropriate, followed by an anneal to diffuse p-type dopant (in this example) into the intrinsic base regions to form the emitter junctions. Transistors 30, 40 are then completed by spacer formation, silicide formation, and the deposition of insulator layer 41 overall. Contacts are etched through insulator layer 41, and filled with contact plugs to provide connection to the collector, base, and emitter, respectively, of transistors 30, 40. A first level of aluminum or copper metallization is then deposited and photolithographically patterned to define conductors that make contact to these terminals of transistors 30, 40.

According to this embodiment of the invention, therefore, high voltage and high performance bipolar transistors may be simultaneously formed in the same epitaxial SOI active layer, with no additional process steps required to do so. The distinction between high voltage and high performance transistors is made by a photolithographic pattern that defines the location of heavily-doped buried collector regions in the epitaxial layer. Further, the shape and location of the buried collector regions may be selected, in combination with the doping level in the remaining collector region, to set a desired breakdown voltage BVCEO. Ring-shaped buried collector contact regions are preferably provided in the high voltage transistor, to minimize collector resistance while maintaining a high breakdown voltage. The process is also highly compatible with the formation of MOS devices elsewhere in the integrated circuit, where BiCMOS technology is used.

As noted above, while the preferred embodiment of the invention is described in connection with, p-n-p transistors, the same method and construction is equivalently applicable to the fabrication of n-p-n devices. It is further contemplated that complementary processes according to the preferred embodiment of the invention may be used in the same integrated circuit, to fabricate complementary bipolar SOI integrated circuits. By further extension, the resulting integrated circuit may include both complementary bipolar and complementary MOS devices.

Figure 4A:
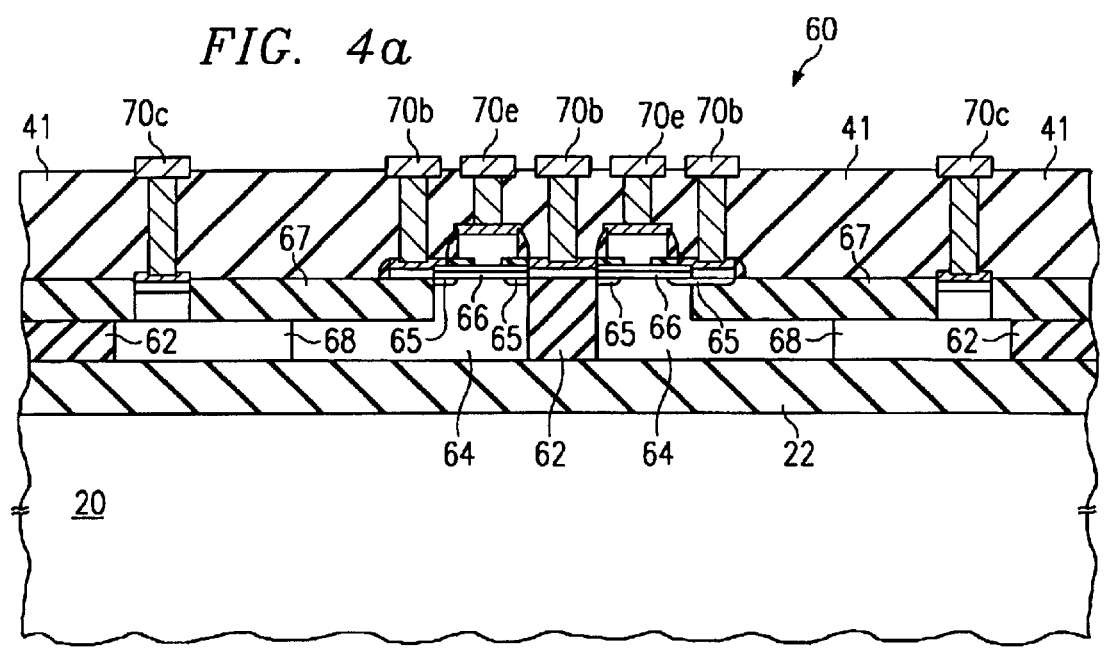
FIGS. 4a and 4b are cross-section and plan views, respectively, of a high voltage bipolar transistor according to a second preferred embodiment of the invention.
Figure 4B:
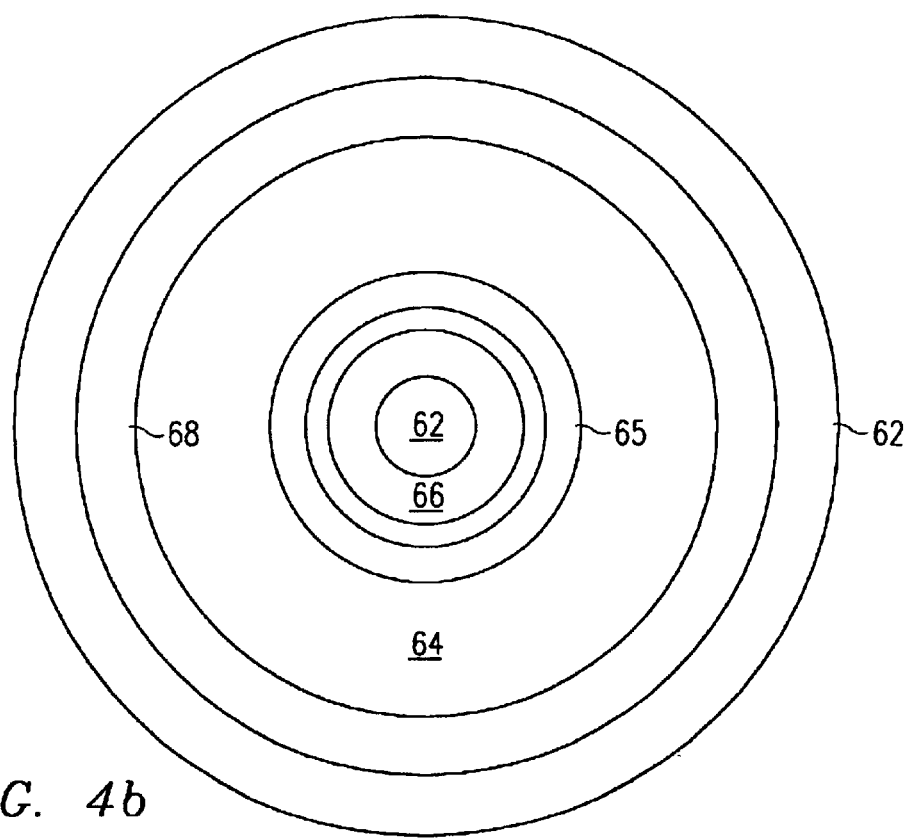

Referring now to FIGS. 4a and 4b, high voltage transistor 60 according to a second preferred embodiment of the invention will now be described. Substrate 20 serves as a handle wafer, upon which buried oxide layer 22 is disposed as before. Transistor 60 is similar to transistor 30 as described above, and as such includes collector region 64 of a substantially circular shape, extending from below emitter regions 66 to buried collector layer 68. As shown in FIG. 4b, buried collector layer 68 has an annular shape, surrounding the collector layer in the same epitaxial layer overlying buried oxide layer 22. Collector contacts are formed by way of sinker structures and contact plugs, up to metal conductor 70c as shown in FIG. 4a.

According to this embodiment of the invention, ring-shaped emitter region 66 surrounds deep trench isolation structure 62 which is placed in the center of transistor 50. It is contemplated that the diameter of isolation structure 62 is on the order of 1 μm. An extrinsic emitter electrode is in contact with emitter region 66, is also preferably annular in shape, and is in contact with emitter conductors 70e by way of contact plugs, as before. Intrinsic base region 65 surrounds emitter region 66 (and of course underlies emitter region 66 to provide a bipolar transistor structure); extrinsic base regions are in contact with intrinsic base region 65, for purposes of making contact to base conductors 70b via contact plugs.

According to this second preferred embodiment of the invention, central deep trench isolation structure 62, and the corresponding ring-shaped emitter and base structures as shown in FIG. 4b, provide further improvement in the performance of high voltage transistor 60. The circular or annular shape of the base and emitter structures minimizes the extrinsic base and collector resistances, by effectively maximizing the width of the conduction path in these structures. This construction also maintains near optimum base-to-collector and emitter-to-base capacitances, by ensuring that the overlap area is no worse than a standard linear layout.

As described above, because transistor 60 also provides annular spaced-apart buried collector regions 68 according to this embodiment of the invention, transistor 60 may have its breakdown voltage BVCEO set by way of a photolithographic patterning, in a manner that is consistent with the formation of high performance devices elsewhere in the same SOI integrated circuit. As such, the high voltage transistor of this second preferred embodiment of the invention provides the same advantages as discussed above relative to the first preferred embodiment of the invention, as well as providing the reduced base resistance and minimized parasitic capacitances noted above.

Referring now to FIG. 5, transistor 70 according to another alternative embodiment of the invention is illustrated. Transistor 70 is particularly well-suited for not only high-voltage operation, but also for high-power (i.e., high current drive) operation. As shown by the plan view of FIG. 5, transistor 70 has elongated annular features, with a major axis (horizontal in the view of FIG. 5) that is much longer than the minor axis (vertical in the view of FIG. 5). In this embodiment of the invention, transistor 70 is constructed similarly as transistor 60 described above, with identical structure when viewed in cross-section. Rather than having a circular structure in plan view, however, transistor 70 has an elongated emitter region 76 that surrounds central deep trench isolation structure 72. Intrinsic base region 75 surrounds (and underlies) emitter region 76. As in the embodiments described above, an extrinsic base and emitter electrodes are in contact, via contact plugs, with intrinsic base region 65 and emitter region 76, respectively.

The elongated arrangement of transistor 70 provides an area-efficient device for high power conduction. In effect, transistor 70 is substantially a one-dimensional device, as the bulk of its collector-emitter current is conducted along the major axis of the structure, rather than at the curved ends. The radius of curvature of the ends of transistor 70 may be optimized for the desired breakdown characteristics. Additional current drive may be provided by implementing multiple transistors 70 laid out in parallel with one another, and connected electrically in parallel with one another; further in the alternative, a single device may be constructed having multiple "finger" like elongated structures similar to transistor 70, but extending from a common structure along one end of the parallel structures. In each of these arrangements, the layout area required for transistor 70 is minimized for a given level of current drive, in a structure that also attains the benefits of permitting both high-voltage and high-performance devices in the same SOI integrated circuit.

While the present invention has been described according to its preferred embodiments, it is of course contemplated that modifications of, and alternatives to, these embodiments, such modifications and alternatives obtaining the advantages and benefits of this invention, will be apparent to those of, ordinary skill in the art having reference to this specification and its drawings. It is contemplated that such modifications and alternatives are within the scope of this invention as subsequently claimed herein.

We claim:

1. An integrated circuit structure including a high voltage bipolar transistor, comprising:

a handle wafer;

an insulator layer overlying a surface of the handle wafer;

a first epitaxial semiconductor layer having a first thickness overlying the insulator layer, and including in the first epitaxial layer at least one doped collector contact region and a first collector region, the collector contact region being substantially more heavily doped than the first collector region;

a second collector region having a second thickness overlying at least a portion of the first collector region;

a base region disposed at a surface of the second collector region; and an emitter region disposed at a surface of the base region.

2. The structure of claim 1, wherein the collector contact region is ring-shaped;

and wherein the first collector region is disposed in the first epitaxial semiconductor layer interiorly to the ring-shaped collector contact region.

3. The structure of claim 2, further comprising:

a second epitaxial semiconductor layer having the second collector region therein, the second collector region being similarly doped as the first collector region in the first epitaxial semiconductor layer.

4. The structure of claim 2, further comprising:

an isolation structure disposed centrally through the first and second epitaxial semiconductor layers to the insulator layer; and at least one isolation structure disposed through the first and second epitaxial semiconductor layers to the insulator layer radially outside of the collector contact region from the centrally disposed isolation structure.

5. The structure of claim 4, wherein the first collector region, and the base and emitter regions, each surround the centrally disposed isolation structure.

6. The structure of claim 2, further comprising a high performance transistor that comprises:

first epitaxial semiconductor layer overlying the insulator layer, and including a buried collector region having a doping concentration substantially the same as the collector contact regions of the high voltage transistor;

a second epitaxial semiconductor layer having an third collector region therein that overlies the buried collector region in the first epitaxial semiconductor layer;

a base region disposed at a surface of the collector region; and an emitter region disposed at a surface of the base region.

7. The structure of claim 6, wherein a portion of the second epitaxial semiconductor layer having the second collector region therein overlies the first collector region in the first epitaxial semiconductor layer of the high voltage transistor, where the second collector region of the second epitaxial semiconductor layer is similarly duped as the first collector region in the first epitaxial semiconductor layer.

8. The structure of claim 7, wherein the base regions in the high performance and high voltage transistors each comprise silicon and germanium.

* * * * *